(12) United States Patent
Larsen et al.

(10) Patent No.: US 10,631,436 B1
(45) Date of Patent: Apr. 21, 2020

(54) HEAT SINK ASSEMBLY

(71) Applicant: International Business Machines Corporation, Armonk, NY (US)

(72) Inventors: Curtis E. Larsen, Eden Valley, MN (US); Karl Stathakis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/191,009

(22) Filed: Nov. 14, 2018

(51) Int. Cl.
*H05K 7/20* (2006.01)
*G06F 1/20* (2006.01)
*F28F 7/00* (2006.01)

(52) U.S. Cl.
CPC ....... *H05K 7/20418* (2013.01); *H05K 7/2049* (2013.01); *H05K 7/20481* (2013.01)

(58) Field of Classification Search
CPC ................. H05K 7/20; G06F 1/20; F28F 7/00
USPC ..... 361/710, 679.47, 679.54, 690, 700, 704; 165/80.3, 80.4, 104.2, 104.33, 185; 1/1
See application file for complete search history.

(56) References Cited

U.S. PATENT DOCUMENTS

| | | | |
|---|---|---|---|
| 5,184,281 A | 2/1993 | Samarov et al. | |
| 6,012,510 A | 1/2000 | Cook | |
| 6,286,586 B2 | 9/2001 | Cook | |
| 6,598,666 B2 | 7/2003 | Lin | |
| 7,031,162 B2 | 4/2006 | Arvelo et al. | |
| 7,111,667 B2 * | 9/2006 | Chang | H01L 23/367 165/104.33 |
| 7,123,482 B2 | 10/2006 | Barsun et al. | |
| 7,667,970 B2 * | 2/2010 | Ma | H01L 23/3672 361/704 |
| 2003/0128518 A1 * | 7/2003 | Gaynes | H01L 23/3675 361/704 |
| 2005/0207115 A1 * | 9/2005 | Barsun | G06F 1/20 361/690 |
| 2007/0169919 A1 * | 7/2007 | Deng | H01L 23/427 165/104.33 |
| 2008/0295993 A1 * | 12/2008 | Chen | H01L 23/427 165/80.3 |
| 2010/0319880 A1 * | 12/2010 | Yu | H01L 23/427 165/104.26 |
| 2011/0286175 A1 * | 11/2011 | Iyengar | G06F 1/20 361/679.47 |
| 2011/0286179 A1 * | 11/2011 | Motschman | G06F 1/20 361/679.54 |
| 2016/0165757 A1 * | 6/2016 | Norton | H01L 23/3672 165/80.4 |
| 2017/0164520 A1 * | 6/2017 | Barron | H05K 7/20509 |
| 2019/0045663 A1 * | 2/2019 | Shia | F28D 15/0233 |

* cited by examiner

*Primary Examiner* — Xiaoliang Chen
(74) *Attorney, Agent, or Firm* — Nathan M. Rau

(57) ABSTRACT

A heat sink assembly, includes: a first heat sink; an adhesive thermal interface material applied to the first heat sink to mate the first heat sink to a first heat-generating component; a second heat sink; one or more support members connecting the first heat sink and the second heat sink; and a non-adhesive thermal interface material applied to the second heat sink to mate the second heat sink to a second heat-generating component.

11 Claims, 4 Drawing Sheets

HEAT SINK ASSEMBLY

BACKGROUND

Field of the Invention

The field of the invention is a heat sink assembly, or, more specifically, a heat sink assembly for mating a second heat sink to a heat-generating component using support members anchoring the second heat sink to a first heat sink.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Electrical components, such as those found in computer systems, can generate substantial heat when operating at high speed. It may be desired to remove heat from heat-generating components, such as processors and/or field programmable gate arrays (FPGAs) using heat sinks. Heat sinks may include a base for conducting the heat of a heat-generating component, and fins to dissipate heat into ambient air.

SUMMARY

A heat sink assembly can comprise a first heat sink; an adhesive thermal interface material applied to the first heat sink to mate the first heat sink to a first heat-generating component; a second heat sink; one or more support members connecting the first heat sink and the second heat sink; and a non-adhesive thermal interface material applied to the second heat sink to mate the second heat sink to a second heat-generating component.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
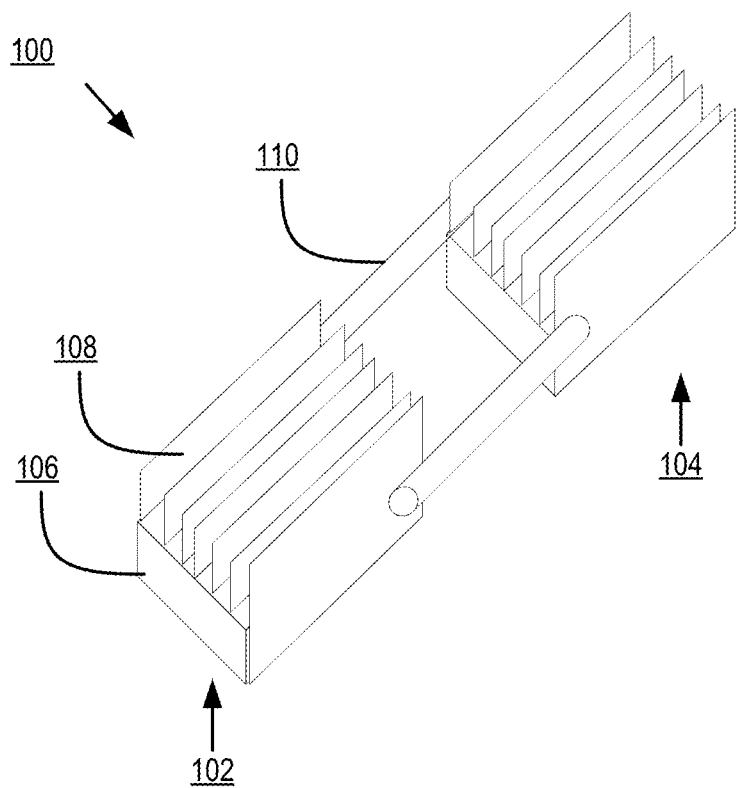
FIG. 1 is a diagram of an example heat sink assembly.

Exemplary methods and products for a heat sink assembly in accordance with the present invention are described with reference to the accompanying drawings, beginning with FIG. 1. FIG. 1 sets forth a diagram of a heat sink assembly 100 configured for mating a second heat sink to a heat-generating component using support members anchoring the second heat sink to a first heat sink according to embodiments of the present invention.

The heat sink assembly 100 comprises a first heat sink 102 and a second heat sink 104. The first heat sink 102 and second heat sink 104 each include a base 106. When the heat sink assembly 100 is mounted (e.g., to a circuit board or other component of an apparatus), the base 106 of the first heat sink 102 and second heat sink 104 mate to a first heat-generating component and second heat-generating component (e.g., a processor, a field programmable gate array (FPGA), or other heat-generating component as can be appreciated). Accordingly, the base 106 is comprised of a heat conducting material (e.g. metal).

The first heat sink 102 and second heat sink 104 also each include a plurality of fins 108. Each of the fins 108 is attached to the base 106 so as to conduct heat from the base 106 and pass the conducted heat into ambient air. Thus, heat from a heat-generating component is conducted to the fins 108 via the base 106 and dissipated into the ambient air. The fins 108 may be attached to the base 106 through welding or soldering. The fins 108 may also be formed with the base 106 by metal extrusion, such as aluminum extrusion. Although the fins 108 are shown in a "straight" fin arrangement, it is understood that this is merely exemplary, and that other arrangements may be used for the fins 108 (e.g., a "pin" arrangement, a "flared" arrangement). Though not shown, the first heat sink 102 and second heat sink 105 may also include additional components in order to improve heat circulation and dissipation through the fins 108, such as fans.

The first heat sink 102 and second heat sink 104 are connected by one or more support members 110. Support members 110 are rigid or semi-rigid components to anchor the second heat sink 104 to the first heat sink 102. As shown in more detail in FIG. 2, the support members 110 may be formed such that, when the first heat sink 102 is mated to a first heat-generating component, the support members 110 apply a torque to as to mate the second heat sink 104 to a second heat-generating component. For the purpose of this discussion, a heat sink is considered "mated" to a heat-generating component when the heat sink is thermally coupled to the heat-generating component.

The support members 110 may be formed with a curve or angle such that the support members 110 are at least partially straightened when the heat sink assembly 100 is mounted, thereby providing the torque to mate the second heat sink 104 to a second heat-generating component. The support member 110 may include wires, rods, or other supports as can be appreciated. The support members 110 may be comprised of thermally conductive material (e.g. metal) to provide heat transfer between the first heat sink 102 and second heat sink 104, and to provide for additional surface area for heat dissipation into the ambient air. The support members 110 may also be comprised of thermally insulating material.

The underside (not shown) of the bases 106 may have a thermal interface material applied to facilitate mating by the first heat sink 102 and second heat sink 104 to the first and second heat-generating components, respectively. A thermal interface material serves to improve thermal coupling between a heat source (e.g., a heat-generating component) and a heat sink (e.g., the first heat sink 102 or second heat sink 104). The thermal interface material improves the thermal coupling by filling air gaps between a heat source and a heat sink that would otherwise be present.

Thermal interface materials may include adhesive thermal interface materials. Adhesive thermal interface materials provide both adhesion and thermal coupling between a heat source and a heat sink. Examples of adhesive thermal interface materials include thermal tape and thermal glue. Thermal interface materials may also include non-adhesive thermal interface materials, which have little-to-no adhesive properties. Examples of non-adhesive thermal interface materials include thermal grease, thermal gap filler, or thermally conductive pads.

Figure 2:
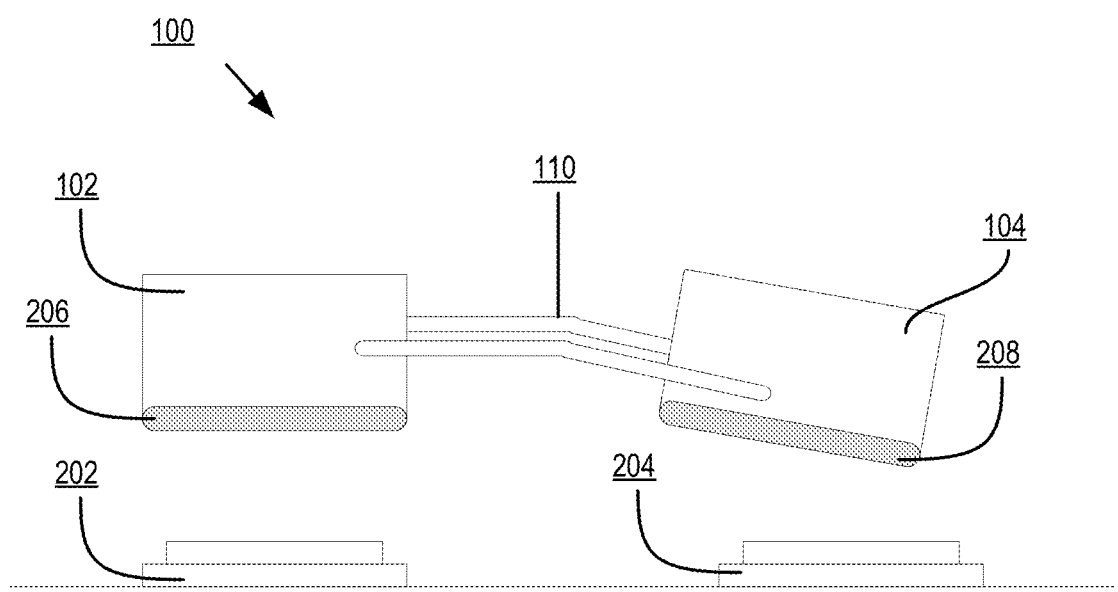
FIG. 2 is a diagram of an example unmounted heat sink assembly.

FIG. 2 shows a profile view of the heat sink assembly 100 unmounted relative to a first heat-generating component 202 and second heat-generating component 204. The first heat-generating component 202 and second heat-generating component 204 can each comprise, for example, a processor, field programmable gate array, or other component mounted on a printed circuit board or other apparatus component. In this example, the first heat sink 102 has an adhesive thermal interface material 206 (e.g., thermal glue or thermal tape) applied to its base 106. The second heat sink 104 has a non-adhesive thermal interface material 208 (e.g., thermal grease, thermal gap filler, or a thermally conductive pad) applied to its base 106. The support members 110 of the heat sink assembly 100 are formed with an angle such that, when the heat sink assembly 100 is mounted, a torque is generated to mate the second heat sink 104 to the second heat-generating component 204.

Figure 3:
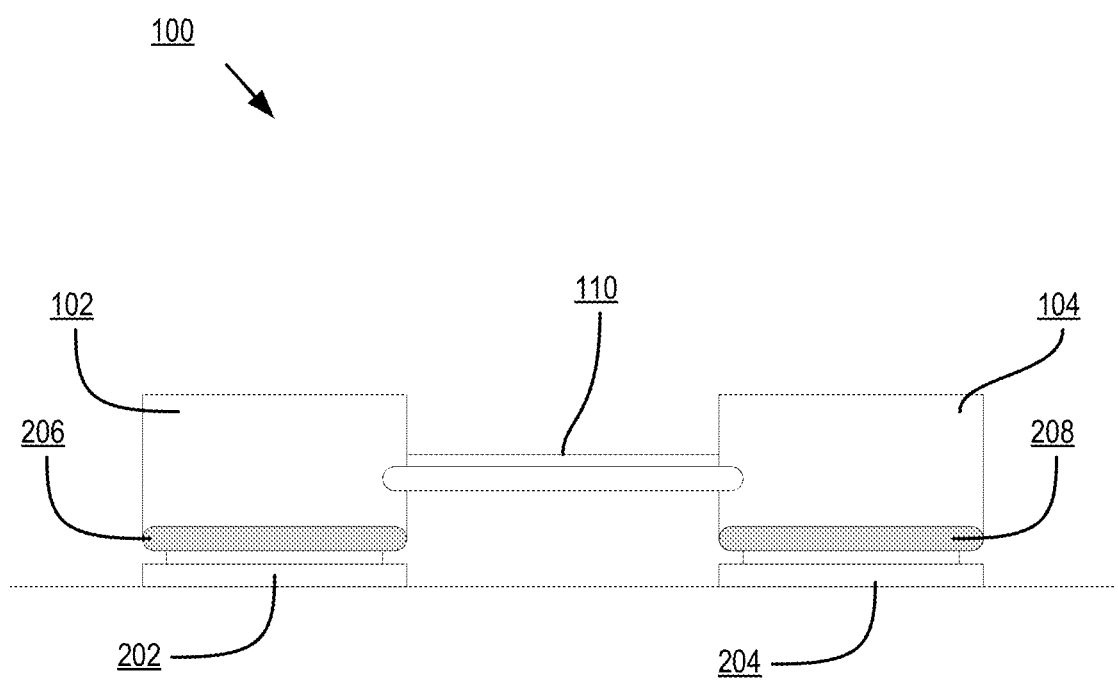
FIG. 3 is a diagram of an example mounted heat sink assembly.

FIG. 3 shows a profile view of the heat sink assembly 100 in a mounted position. When the heat sink assembly 100 is mounted, the first heat-generating component 102 is mated to the first heat-generating component 202, and the second heat-generating component 104 is mated to the second heat-generating component 204. Here, the first heat sink 102 is securely mated to the first heat-generating component 202 using the adhesive thermal interface material 206. As the support members 110 have been deformed into a straightened shape, the support members 110 generate a torque by virtue of their tendency to reform into their original shape. The torque generated by the support members 110 forces the second heat sink 104 into contact with the second heat-generating component 204, thereby mating the second heat sink 104 to the second heat-generating component 204. The mating between the second heat sink 102 and second heat-generating component 204 is facilitated by the non-adhesive thermal interface material 208.

Though the first heat sink 102 is shown as being securely mated to the first heat-generating component 202 using the adhesive thermal interface material 206, it is understood that additional components or combinations of components may also serve to mate the first heat sink 102 to the first heat-generating component 202. For example, one or more clamps, clips, screws, or other components to immobilize the first heat sink 102 in place as mated to the first heat-generating component 202. For example, the torque generated by the support members 110 may be stronger than the adhesive properties provided by the adhesive thermal interface material 206. Accordingly, additional components may be required to immobilize the first heat sink 102 as mated to the first heat-generating component 202. In an alternative embodiment, the first heat sink 102 can be mated to the first heat-generating component 202 using only mechanical immobilization (e.g., only using screws, clamps, clips, etc.). The first heat sink 102 can also be mated to the first heat-generating component 202 using a combination of mechanical immobilization (e.g., using screws, clamps, clips, etc.) and non-adhesive thermal interface materials 208.

As the second heat sink 104 is anchored to the first heat sink 102 by the support members 110, and because the first heat sink 102 is securely mated to the first heat-generating component 202, the second heat sink 104 need not be mechanically or adhesively coupled to the second heat-generating component 204. This provides several advantages. Non-adhesive thermal interface materials 208 may provide better thermal conductivity when compared to adhesive thermal interface materials 206. However, a heat sink using non-adhesive thermal interface materials 208 would typically need to be physically immobilized using screws, clamps, etc., each of which takes up space on a circuit board that could otherwise be used for circuitry. Here, as no mechanical components are required to immobilize the second heat sink 102, circuit board space that would be otherwise used for latches, clamps, screws, etc. can instead be used for additional circuitry or other functional components.

Figure 4:
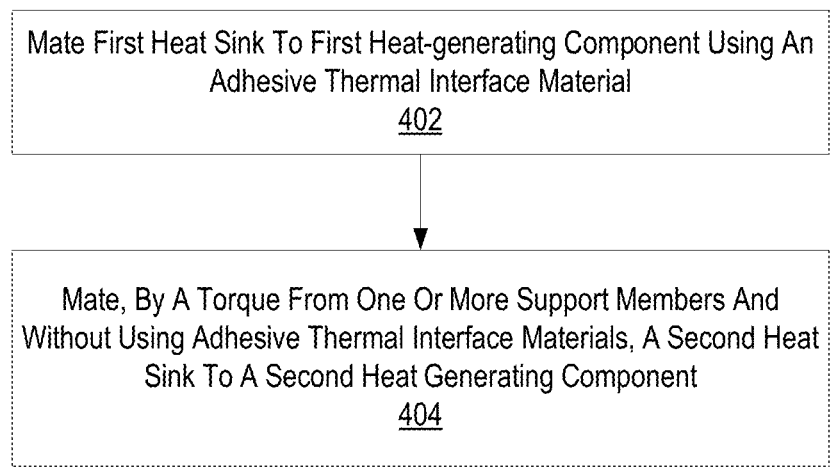
FIG. 4 is a flowchart of an example method.

For further explanation, FIG. 4 sets forth a flow chart illustrating an exemplary method for mounting a heat sink assembly according to embodiments of the present invention that includes mating 402 a first heat sink 102 to a first heat-generating component 202 using an adhesive thermal interface material 206. The first heat sink 102 can be physically coupled to a second heat sink 104 using one or more support members 110. The support members 110 can comprise rods, wires, or other components as can be appreciated. The support members 110 can be formed to provide a torque to the second heat sink 102 to mate the second heat sink 102 to a second heat-generating component 204. Accordingly, the support members 110 can be formed with a curve, angle, or other formation such that, when deformed, the support members 110 provide the torque.

Mating the first heat sink 102 to a first heat-generating component 202 using an adhesive thermal interface material 206 may include applying thermal glue or thermal tape to a base 106 of the first heat-generating component 202 and adhering the first heat sink 102 to the first heat-generating component 202. Mating the first heat sink 102 to a first heat-generating component 202 using an adhesive thermal interface material 206 may include physically immobilizing the first heat sink 102 using one or more clamps, clips, latches, screws, etc.

The method of FIG. 4 may also include mating 404, by a torque from one or more support members 110 and without using adhesive thermal interface materials 206, the second heat sink 104 to the second heat-generating component 204. Mating 404, by a torque from one or more support members 110 and without using adhesive thermal interface materials 206, the second heat sink 104 to the second heat-generating component 204 may include deforming (e.g., straightening) the support members 110 such that the support members 110 attempt to return to their original shape (e.g., curved or angled), thereby providing a torque to the second heat sink 104. As the first heat sink 102 is securely mated to the first heat-generating component 202 (using adhesive thermal interface materials 206 and/or physical immobilization), the torque forces the base 106 of the second heat sink 102 into a thermally coupled position with the second heat-generating component 202, thereby mating the second heat sink 102 to the second heat-generating component 202. Mating 404, by a torque from one or more support members 110 and without using adhesive thermal interface materials 206, the second heat sink 104 to the second heat-generating component 204 may include mating the second heat sink 102 to the second heat-generating component 202 using non-adhesive thermal interface materials 208. For example, non-adhesive thermal interface materials 208 such as thermal grease, thermally conductive pads, or thermal gap fillers can facilitate thermal coupling between a base 106 of the second heat sink 104 and the second heat-generating component 202.

In view of the explanations set forth above, readers will recognize that the benefits of the heat sink assembly according to embodiments of the present invention include:

Increased thermal conductivity using non-adhesive thermal interface materials

Freeing circuit board space that would otherwise be used for clamps, latches, screws, etc. to secure heat sinks It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A heat sink assembly, comprising:
a first heat sink;
an adhesive thermal interface material applied to the first heat sink to mate the first heat sink to a first heat-generating component;
a second heat sink;
one or more support members connecting the first heat sink and the second heat sink, wherein the one or more support members apply a torque to the second heat sink in response to the first heat sink being mated to the first heat-generating component; and
a non-adhesive thermal interface material applied to the second heat sink to mate the second heat sink to a second heat-generating component, wherein the torque from the one or more supporting members mates the second heat sink to, and in contact with, the second heat-generating component.

2. The heat sink assembly of claim 1, wherein the one or more support members comprise one or more wires or one or more rods.

3. The heat sink assembly of claim 1, wherein the adhesive thermal interface material comprises a thermal glue or a thermal tape.

4. The heat sink assembly of claim 1, wherein the non-adhesive thermal interface material comprises a thermal grease or a thermally conductive pad.

5. The heat sink assembly of claim 1, wherein the first heat-generating component or the second heat-generating component comprise a processor.

6. The heat sink assembly of claim 1, wherein the first heat-generating component or the second heat-generating component comprise a field programmable gate array.

7. An apparatus, comprising:
a first heat-generating component;
a second heat-generating component;
a heat sink assembly, comprising:
a first heat sink;
an adhesive thermal interface material applied to the first heat sink to mate the first heat sink to the first heat-generating component;
a second heat sink;
one or more support members connecting the first heat sink and the second heat sink, wherein the one or more support members apply a torque to the second heat sink in response to the first heat sink being mated to the first heat-generating component; and
a non-adhesive thermal interface material applied to the second heat sink to mate the second heat sink to a second heat-generating component, wherein the torque from the one or more supporting members mates the second heat sink to, and in contact with, the second heat-generating component.

8. The apparatus of claim 7, wherein the one or more support members comprise one or more wires or one or more rods.

9. The apparatus of claim 7, wherein the adhesive thermal interface material comprises a thermal glue or a thermal tape.

10. The apparatus of claim 7, wherein the non-adhesive thermal interface material comprises a thermal grease or a thermally conductive pad.

11. The apparatus of claim 7, wherein the first heat-generating component or the second heat-generating component comprise a processor or a field programmable gate array.

* * * * *